United States Patent
Svilans

(10) Patent No.: US 9,451,341 B2
(45) Date of Patent: Sep. 20, 2016

(54) MONITOR PHOTODIODE MULTIPLEXER FOR INTEGRATED PHOTONIC SWITCHES

(71) Applicant: Huawei Technologies Co., Ltd., Shenzhen (CN)

(72) Inventor: Mikelis Svilans, Kanata (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 23 days.

(21) Appl. No.: 14/537,651

(22) Filed: Nov. 10, 2014

(65) Prior Publication Data

US 2016/0134952 A1 May 12, 2016

(51) Int. Cl.
*H04B 10/60* (2013.01)
*H04B 10/80* (2013.01)
*H04Q 11/06* (2006.01)
*H04Q 11/00* (2006.01)

(52) U.S. Cl.
CPC ........... *H04Q 11/0062* (2013.01); *H04B 10/60* (2013.01); *H04B 10/801* (2013.01); *H04Q 2011/0083* (2013.01); *H04Q 2213/308* (2013.01)

(58) Field of Classification Search
None
See application file for complete search history.

(56) References Cited

U.S. PATENT DOCUMENTS

| 5,376,782 A * | 12/1994 | Ikeda ................ H01L 27/14643 250/208.1 |
|---|---|---|
| 2008/0265133 A1 | 10/2008 | Sawtell et al. |
| 2011/0101208 A1 | 5/2011 | Saito et al. |
| 2011/0158641 A1 | 6/2011 | Barnard et al. |
| 2013/0002488 A1 | 1/2013 | Wang et al. |

FOREIGN PATENT DOCUMENTS

CN 101779347 A 7/2014

\* cited by examiner

*Primary Examiner* — Darren E Wolf
(74) *Attorney, Agent, or Firm* — Slater Matsil, LLP

(57) ABSTRACT

System and method embodiments are provided for monitor photodiode multiplexers for integrated photonic switches. Embodiment monitor photodiode multiplexers provide simplified control circuits, reduced power consumption, and improved manufacturability as compared to other solutions. In an embodiment, a photonic integrated circuit (PIC), includes a plurality of input terminals; a plurality of output terminals; and a plurality of monitor elements wherein each of the monitor elements is connected between one of the input terminals and one of the output terminals, wherein each monitor element comprises a photodiode and a rectifier diode, wherein the photodiode comprises a first terminal and a second terminal, wherein the rectifier diode comprises a third terminal and a fourth terminal, wherein the first terminal is connected to the third terminal, and wherein the first and third terminals comprise a same polarity.

20 Claims, 5 Drawing Sheets

__US 9,451,341 B2__

MONITOR PHOTODIODE MULTIPLEXER FOR INTEGRATED PHOTONIC SWITCHES

TECHNICAL FIELD

The present invention relates to a photonic integrated circuit (PIC), and, in particular embodiments, to systems and apparatuses for photodiode multiplexers.

BACKGROUND

Integrated photonic devices have great potential for a switching fabric in ultra-small photonic lightwave circuits (PLCs) on low-cost silicon-on-insulator (SOI) substrates. They can include waveguides, splitters, combiners, Mach-Zehnder interferometers, array waveguide gratings (AWGs), and photodiodes for processing optical signals, which fall within the customary telecommunication wavelength bands such as the 1310 nanometer (nm) or 1550 nm bands.

The fabrication process for PLCs is subject to dimensional and compositional tolerances, which may require active tuning or trimming elements in order to function as designed. Photodiodes may be used to monitor the state of the integrated photonic devices by providing electrical feedback signals to electronic driver circuitry used to control them.

As the PLC complexity increases with a growing number of integrated photonic devices, the number of required monitor photodiodes (MPDs) also increases. However, the number of available electrical connections to the PLC may be limited, which could severely limit the PLC complexity if each MPD were required to have an individual connection to external driver circuitry.

SUMMARY

In accordance with an embodiment, a photonic integrated circuit (PIC), includes a plurality of input terminals; a plurality of output terminals; and a plurality of monitor elements wherein each of the monitor elements is connected between one of the input terminals and one of the output terminals, wherein each monitor element comprises a photodiode and a rectifier, wherein the photodiode comprises a first terminal and a second terminal, wherein the rectifier comprises a third terminal and a fourth terminal, wherein the first terminal is connected to the third terminal, and wherein the first and third terminals comprise a same polarity.

In accordance with an embodiment, a network component configured to monitor optical signals includes a transmitter; a receiver; and an on-chip photonic integrated circuit (PIC), wherein the PIC comprises: a plurality of input terminals; a plurality of output terminals; and a plurality of monitor elements wherein each of the monitor elements is connected between one of the input terminals and one of the output terminals, wherein each monitor element comprises a photodiode and a rectifier, wherein the photodiode comprises a first terminal and a second terminal, wherein the rectifier diode comprises a third terminal and a fourth terminal, wherein the first terminal is connected to the third terminal, and wherein the first and third terminals comprise a same polarity.

In accordance with an embodiment, a method of operating a photonic integrated circuit (PIC) includes applying a bias voltage to one of a plurality of input terminals each connected to a first terminal of at least one of a plurality of monitor elements, wherein each monitor element comprises a photodiode and a rectifier, wherein one terminal of the photodiode is connected to one of the input terminals and one terminal of the rectifier is connected to one of a plurality of output terminals; applying at least one optical signal to at least one of the monitor elements; and registering a photocurrent in at least one of the output terminals.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
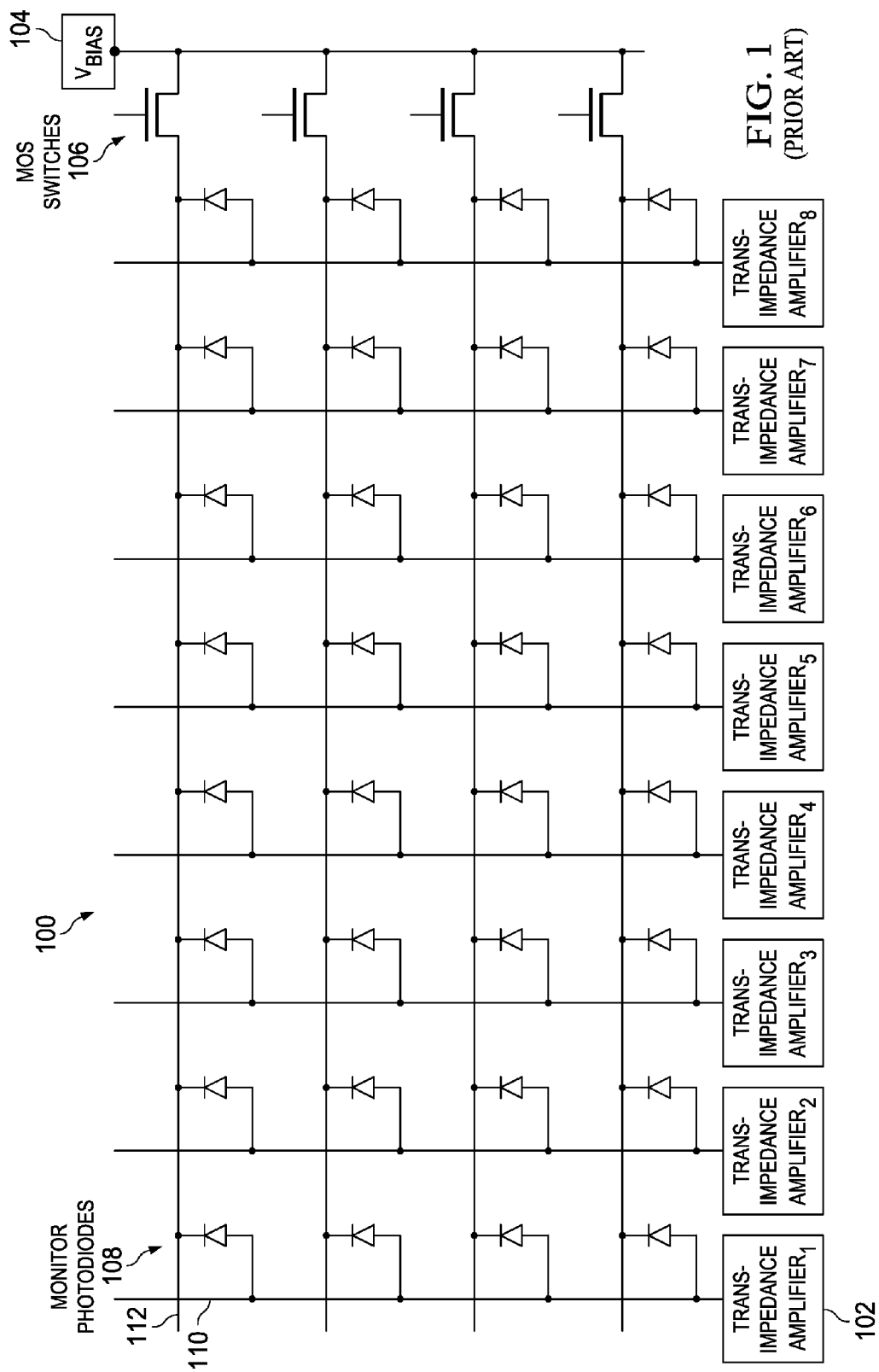
FIG. 1 is a schematic diagram of a simple monitor photodiode (MPD) matrix system.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A monitor photodiode (MPD) multiplexer is disclosed which permits the performance of the monitoring function on a PLC comprising a given number of MPDs with a greatly reduced number of external electrical connections. In most integrated photonic devices the drift with changes in ambient operating conditions or with age occurs at a sufficiently low rate that a periodic sampling of the device state is acceptable for monitoring and feedback purposes.

The disclosed MPD multiplexer includes a matrix connection of the MPDs such that one or more MPDs can be interrogated in sequence. For example, $n^2$ MPDs arranged in an n×n matrix can be operated with only $2n+1$ electrical connections. For an increasingly large n, the reduction in the number of required electrical connections is correspondingly reduced.

As each MPD in operation acts like a current source when illuminated with an optical signal, a simple matrix connection of all anodes in rows and cathodes in columns, for instance, is not feasible, as the photocurrents from all the MPDs in a particular row or column would interfere with each other.

One problem with prior art systems is that as the switch fabric complexity increases, the number of MPD connections rises super-linearly, while the number of electrical connections to the chip are limited.

There are a few examples where current PLCs include MPDs connected to active integrated photonic devices. However, in all known cases, each MPD has individual connections to external circuitry. In contrast, the disclosed embodiments permit a large number of MPDs to be operated using a considerably reduced number of external electrical connections. Embodiments of the disclosed systems and methods have the advantage of permitting a greater PLC complexity with a larger number of integrated photonic devices monitored with MPDs than was possible before.

In an embodiment, to solve the interference problem, an electrical diode is integrated in series with each MPD in order to permit only a selected MPD to be switched on for interrogating.

In an embodiment, an array m×n MPDs includes n bias connections and m connections to m TIAs. In an embodiment, the MPDs are spatially distributed and not in a matrix layout. Each row of MPDs receives a bias sequentially through an electrical switch such as a MOS transistor. The TIAs register the photocurrent of a biased MPD in each column. In an embodiment, a single TIA serves MPDs from multiple columns and multiple rows. In an embodiment, a single TIA serves all of the MPDs in the array.

In an embodiment, m by n MPDs requires (m+n+1) connections and a single TIA. Bias inputs are multiplexed by $B_i$ terminals. Photocurrent outputs are multiplexed by $S_i$ switch terminals.

Various embodiments of this disclosure provide one or more of the following benefits. Some embodiments permit higher complexity in photonic circuits that require monitor photodiodes. Some embodiments are integrable into PICs. Some embodiments simplify the control circuits by reducing the number of required elements. Some embodiments reduce power consumption and improve manufacturability.

Embodiments of the disclosure provide reduced manufacturing cost for large PIC switch arrays and their controllers because of reduced connections and/or reduced number of TIAs. Embodiments of this disclosure are applicable to a great variety of tunable photonic device types such as, for example, Mach-Zehnder Interferometers (MZIs), tunable directional couplers, tunable polarization rotators, and array waveguide gratings (AWGs).

FIG. 1 is a schematic diagram of a simple monitor photodiode (MPD) matrix system 100. System 100 includes a plurality of trans-impedance amplifiers (TIA) 102 (labeled $TIA_1$, $TIA_2$, $TIA_3$, $TIA_4$, $TIA_5$, $TIA_6$, $TIA_7$, $TIA_8$), a bias voltage source 104, a plurality of switches 106, a plurality of bias inputs 112, a plurality of photodiode outputs 110, and a plurality of MPDs 108. Each MPD 108 is connected to one of the bias inputs 112 and one of the photodiode outputs 110. The switches 106 control which of the rows of the MPDs 108 receives a bias voltage. The TIAs 102 convert the photocurrent to a voltage. Every MPD 108 has at least one external electrical connection. An array of m×n MPDs requires at least m+n connections–n for bias supply switches 106 and m for input to TIAs 102.

One problem with system 100 is current leakage. The current into any particular TIA 102 can be an accumulation of the dark currents of several MPDs 108 as well as possibly all the photocurrents, thereby rendering the signal at any TIA 102 indeterminate.

Figure 2:
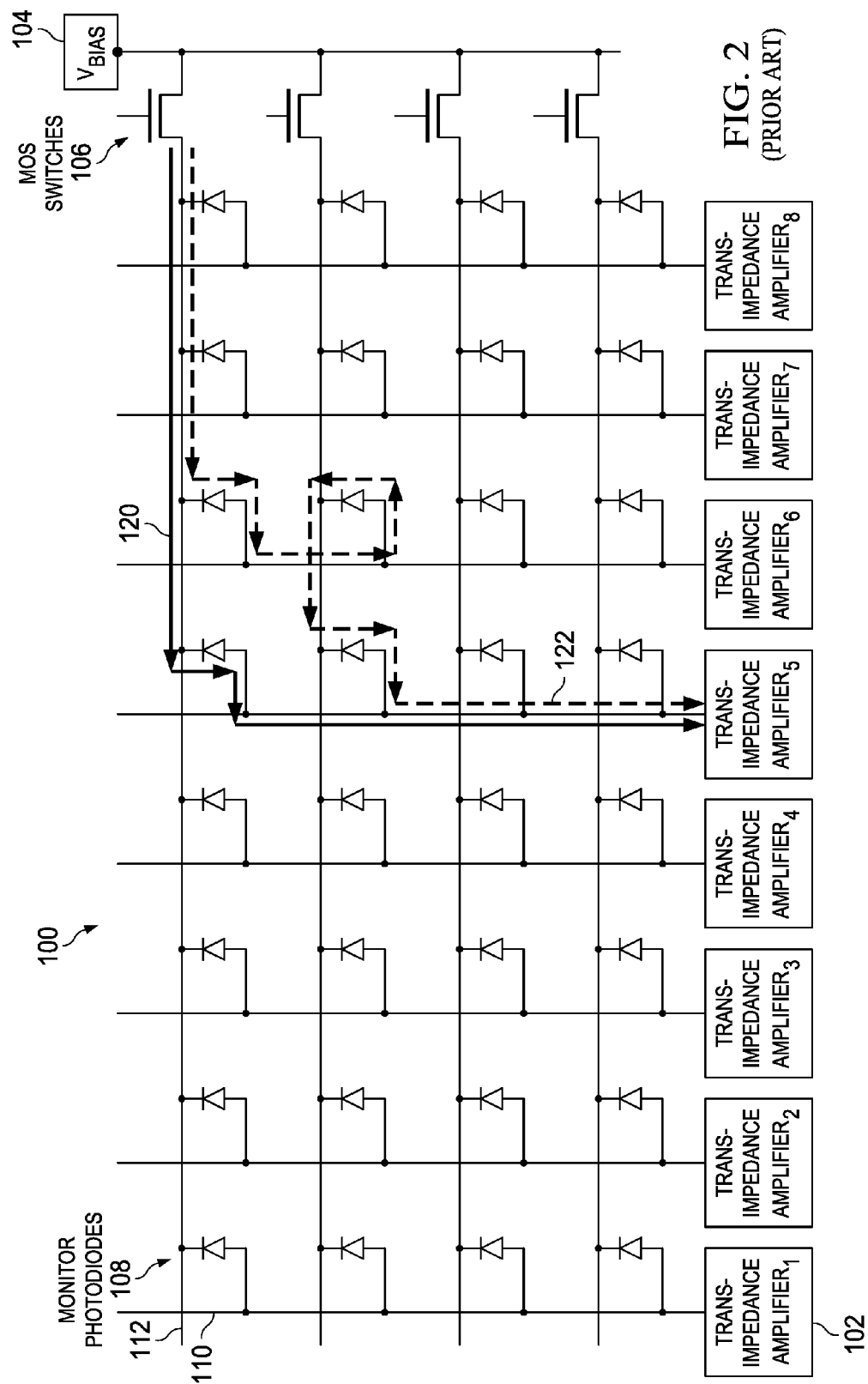
FIG. 2 is a schematic diagram of a simple MPD matrix system illustrating possible current leakage paths.

FIG. 2 is a schematic diagram of prior art MPD matrix system 100 illustrating possible current leakage paths. Two possible current paths 120, 122 are shown. The path 120 is the desired photocurrent path from the MPD 108 selected by the switch 106 into the TIA, being $TIA_5$ in this example. An alternative current path 122 can provide an undesired leakage into $TIA_5$ as shown, especially when the MPDs in the current path 122 are generating a photocurrent from illumination, thereby rendering the signal at $TIA_5$ indeterminate.

Figure 3:
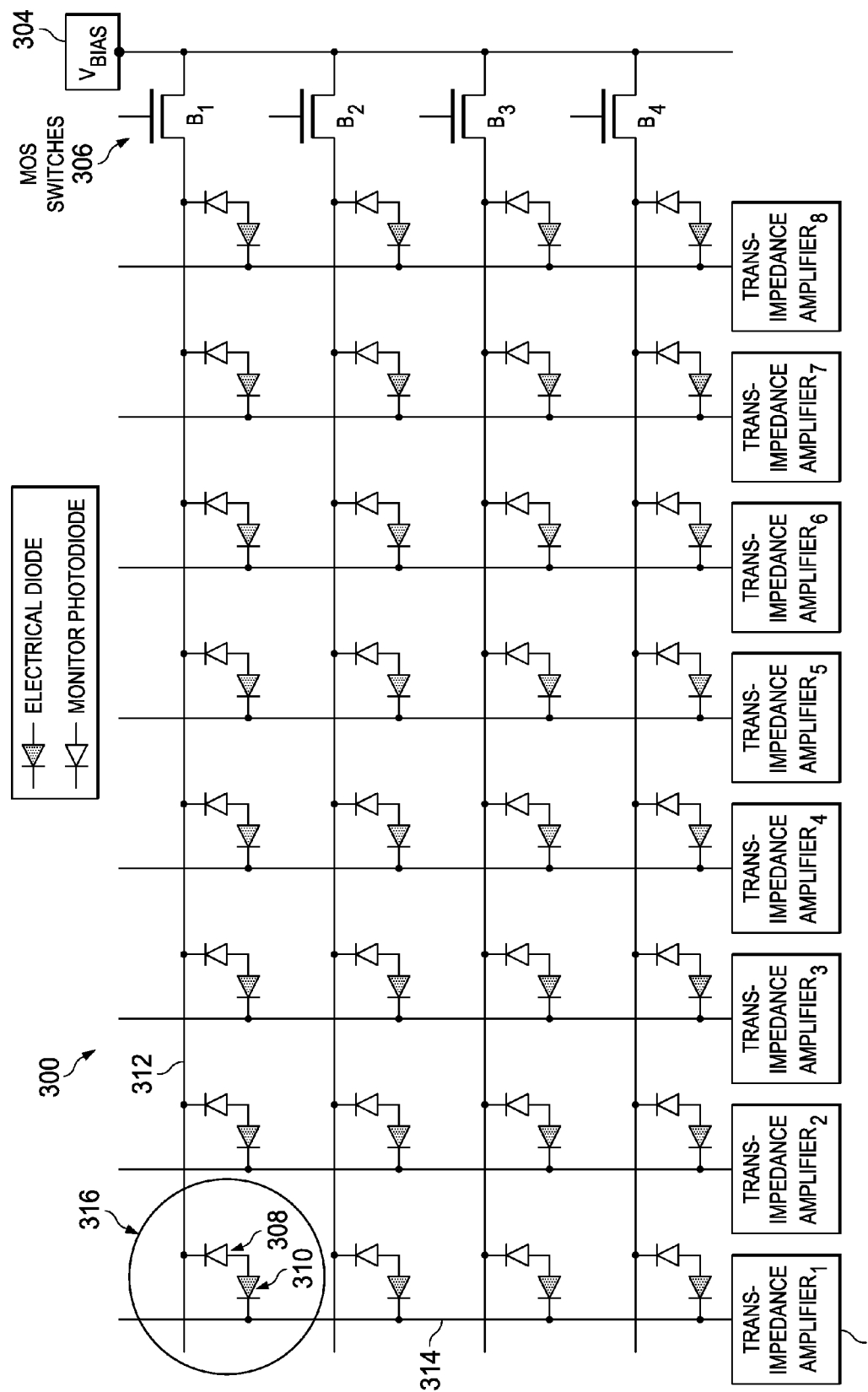
FIG. 3 is a schematic diagram of an embodiment of a system for an improved MPD matrix for on-chip photonics.

FIG. 3 is a schematic diagram of an embodiment of a system 300 for an improved MPD matrix for on-chip photonics. System 300 includes a plurality of n bias inputs 312, a plurality of m MPD outputs 314, and a plurality of up to m×n MPD elements 316 that each comprise an MPD 308 and a rectifier diode 310. In other words, the whole MPD matrix does not need to be filled, so that the number of MPDs can be m×n or less. In an embodiment with m=8 and n=4, a plurality of TIAs 302 (labeled $TIA_1$, $TIA_2$, $TIA_3$, $TIA_4$, $TIA_5$, $TIA_6$, $TIA_7$, $TIA_8$) are connected to the MPD outputs 314, and a plurality of bias voltage switches 306 (labeled $B_1$, $B_2$, $B_3$, and $B_4$) are connected to the bias inputs 312 for applying a bias from a bias voltage source 304. In an embodiment, the switches 306 are metal-oxide-semiconductor (MOS) switches. The rectifier diode 310 is an electrical diode, which does not receive any illumination and therefore cannot function as a photodetector. Although the matrix of MPD elements 316 shows four rows and eight columns, the actual number of rows and columns is not limited to this, but may be any number as required by a particular embodiment.

Each photodiode element 316 includes an MPD 308 and a rectifier diode 310 that are connected in series with the terminals of the same polarity of the MPD 308 and the rectifier diode 310 connected to each other. For example, in an embodiment, the anode of the MPD 308 and the anode of the rectifier diode 310 are connected to each other. In another embodiment, the cathode of the MPD 308 is connected to the cathode of the rectifier diode 310. The other terminal of the MPD 308 is connected to one of the n bias inputs 312 and the other terminal of the rectifier diode 316 is connected to one of the m outputs 314. If the anodes of the MPD 308 and rectifier diode 310 are connected to each other, then the cathode of the MPD 308 is connected to the bias input 312 and the cathode of the rectifier diode 310 is connected to the output 314 when the bias voltage source 304 has a positive polarity. If the cathodes of the MPD 308 and the rectifier diode 310 are connected to each other, then the anode of the MPD 308 is connected to the bias input 312 and the anode of the rectifier diode 310 is connected to the output 314 when the bias voltage source 304 has a positive polarity. If the bias voltage source 304 has a negative polarity, the polarity of the MPD 308 and the rectifier diode 310 connections is reversed. The rectifier diodes 310 inhibit or prevent dark current or photocurrent leakage of MPDs not selected by the bias voltage switch 306 into the TIAs 302.

In an embodiment, in contrast to the prior art, a matrix of m×n MPDs requires only m+n connections and m TIAs, a reduction over the prior art. Because of the inclusion of the rectifier diodes 310, the MPDs 308 can be spatially distributed and do not have to be in a matrix layout. Thus, the matrix depicted in FIG. 3 should be considered a logical matrix and does not indicate the exact physical placement of any component.

In an embodiment, a bias voltage is applied to one of the plurality of input bias terminals 312 and an optical signal is applied to one or more of the MPD elements 316. A photocurrent is registered in one or more of the photocurrent output bias terminals 314. One of the TIAs 302 registers the photocurrent of a biased MPD element 316 in each column.

In an embodiment, each row of MPDs 308 receives bias sequentially through an electrical switch 306. The TIAs 302 register the photocurrent of biased MPDs 308 in each column.

Figure 4:
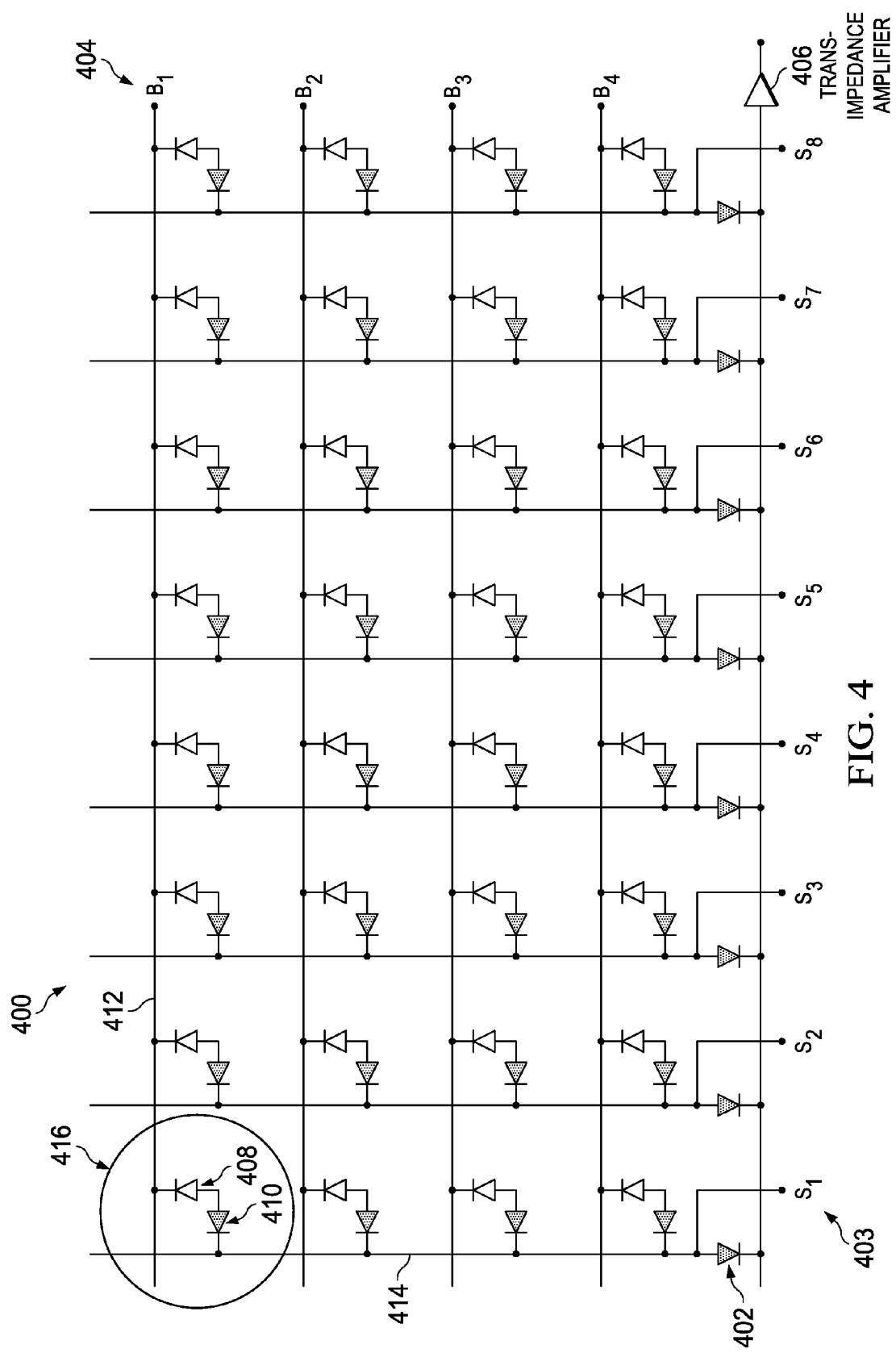
FIG. 4 is a schematic diagram of a system for an improved MPD matrix for on-chip photonics.

FIG. 4 is a schematic diagram of a system 400 for an improved MPD matrix for on-chip photonics. System 400 includes a single TIA 406, a plurality of output switch terminals 403 (labeled $S_1$, $S_2$, $S_3$, $S_4$, $S_5$, $S_6$, $S_7$, and $S_8$), a plurality of input bias switches 404 (labeled $B_1$, $B_2$, $B_3$, and $B_4$) connected to a bias voltage source (not shown), a plurality of bias inputs 412, a plurality of outputs 414, and a plurality of MPD elements 416 that each comprise an MPD 408 and a rectifier diode 410. System 400 is similar to system 300 except that rather than a plurality of TIAs, a single TIA 406 is used for all of or multiple ones of the MPD elements 416. Each of the outputs 414 is connected to the input of TIA 406 through a switch element 402 (e.g., a rectifier diode), which is used as an electrical switch. In normal operation, one of the output columns 414 is selected by applying zero current to the corresponding output switch terminal 403, while applying a bias to all the remaining output switch terminals 403 so that the switch elements 402 are reverse biased with respect to the voltage at the input of the TIA 406. The switch terminals 402 control which column of MPD elements 416 a registered at the TIA 406. In an embodiment the switch elements 402 are rectifier diodes. However, those of ordinary skill in the art will recognize that the switch elements 402 may be implemented as other types of switch elements, such as, for example, field effect transistors (FETs) and is not limited to rectifier diodes.

A system such as system 400 having m×n MPDs requires only m+n+1 total connections (including the connection to the TIA 406). System 400 requires only a single TIA. Bias inputs are multiplexed by $B_i$ terminals 404. Photocurrent outputs are multiplexed by the $S_i$ switches 403. The MPD elements 416 are arranged similarly to the MPD elements 316 in FIG. 3.

Figure 5:
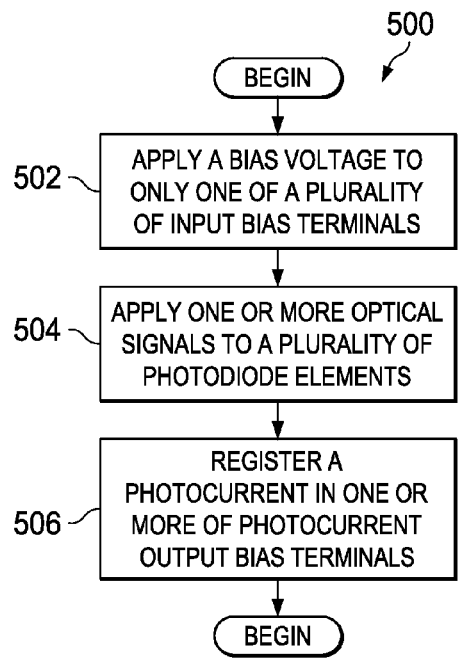
FIG. 5 is a flowchart of an embodiment method for operating a photonic integrated circuit that incorporates a disclosed MPD matrix system.

FIG. 5 is a flowchart of an embodiment method 500 for operating a photonic integrated circuit that incorporates a disclosed MPD matrix system, such as system 300 or 400. The method 500 begins at block 502 where a bias voltage is applied to only one of the input bias terminals. At block 504, one or more optical signals is applied to one or more of the MPD elements. At block 506, a photocurrent is registered in one or more of the plurality of photocurrent output bias terminals, after which, the method 500 ends. In an embodiment, the input bias voltage is applied one-by-one sequentially to multiple ones of the plurality of input bias terminals. In an embodiment, the input bias voltage is applied one-by-one sequentially to every one of the plurality of input bias terminals.

Figure 6:
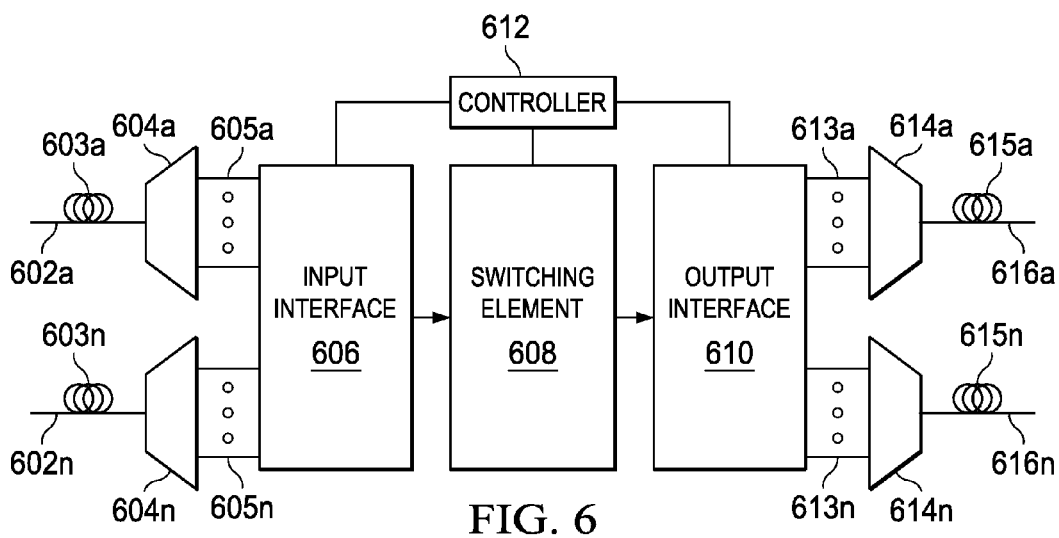
FIG. 6 is a block diagram of an embodiment optical data router.

FIG. 6 is a block diagram of an embodiment optical data router 600. Optical data router 600 is an example of a device or network component that may be used for implementing the apparatuses, systems, and methods disclosed herein. However, it should be noted that the apparatuses, systems, and methods disclosed herein may be implemented in other types of devices other than routers. Specific devices may utilize all of the components shown, or only a subset of the components and levels of integration may vary from device to device. Furthermore, a device may contain multiple instances of a component. Router 600 includes one or more separators 604, an input interface 606, a switching element 608, an output interface 610, a controller 612, and one or more combiners 614. Each separator 604 is configured to separate an input optical signal 603 communicated over a communication link 602. Separator 604 may comprise, for example, a wavelength division demultiplexer. As used throughout this document, the phrases "wavelength division multiplexer" and "wavelength division demultiplexer" may include any optical and/or electrical components—including any hardware, software, and/or firmware—capable of processing wavelength division multiplexed signals and/or dense wavelength division multiplexed signals. In an embodiment, the input interface 606, switching element 608, and/or output interface 610 include a PIC that incorporates the disclosed thermo-optic switches with thermally isolated and heat restricting pillars.

Communication link 602 may include, for example, standard single mode fiber (SMF), dispersion-shifted fiber (DSF), non-zero dispersion-shifted fiber (NZDSF), dispersion compensating fiber (DCF), or another fiber type or combination of fiber types. In some embodiments, communication link 602 is configured to couple router 600 to other optical and/or electro-optical components. For example, link 602 could couple router 600 to a cross-connect or another device operable to terminate, switch, route, process, and/or provide access to and/or from communication link 602 and another communication link or communication device. As used throughout this document, the term "couple" and or "coupled" refers to any direct or indirect communication between two or more elements, whether or not those elements are physically connected to one another. In some embodiments, communication link 602 can comprise a point-to-point communication link or a portion of a larger communication network, such as a ring network, a mesh network, a star network, or other network configuration.

Optical signal 603 may include a multiple wavelength optical signal. For example, optical signal 603 can include at least 5 wavelength channels, at least 100 wavelength channels, or at least 250 wavelength channels. In one particular embodiment, optical signal 603 includes 250 wavelengths having a 50 gigahertz (GHz) spacing within a 100 nanometer (nm) spectral window. In that example, the 100 nm spectral window can be located within the 1400 nm to 1650 nm low-loss window associated with optical fibers. In various embodiments, optical signal 603 can implement one or more data formats, such as, polarization shift keying (PLSK), pulse position modulation (PPM), Multi-Protocol Label Swapping (MPLS), Generalized Multi-Protocol Label Swapping (GMPLS), non-return to zero (NRZ), return to zero (RZ), differential phase shift key (DPSK), or a combination of these or other format types.

In an embodiment, separator 604 is configured or operates to separate optical signal 603 into individual wavelength channels 605 and to couple each wavelength channel 605 to an input interface 606. In an alternative embodiment, separator 604 can separate optical signal 603 into separate multiple-wavelength channels and couple those multiple-wavelength channels to input interface 606. Wavelength channels 605 can comprise, for example, Internet Protocol (IP) packets, voice data, video data, or any other data type and/or data format. In this particular embodiment, each wavelength channel 605 implements a frame format that comprises one or more framing bits, a first packet label that precedes a packet data, and a second packet label that follows the packet data. Surrounding a packet data with packet labels advantageously allows for relatively simple error checking at a destination associated with each wavelength channel 605, however this format is not required. In this example, each wavelength channel 605 implements a Generalized Multi-Protocol Label Swapping (GMPLS) routing protocol within the first and second packet labels. Although this example implements a GMPLS routing protocol, other routing protocols or data formats may be used without departing from the scope of the present disclosure.

In an embodiment, input interface 606 is configured to receive and process each wavelength channel 605 associated with optical signal 603. Input interface 606 can comprise any optical and/or electrical components—including any hardware, software, and/or firmware—capable of processing, converting, replicating, updating, and/or swapping one or more packet labels associated with each wavelength channel 605. In various embodiments, input interface 606 can determine a desired routing for a packet data associated with each wavelength channel 605 and can update a first and/or second packet label using an all-optical label swapping technique. The phrase "all-optical" refers to the performance of a desired functionality substantially free from optical-to-electrical or electrical-to-optical conversions. The "all-optical" functionality does not prohibit optical-to-electrical or electrical-to-optical conversions for use by control circuitry that contributes to the overall function of the device. For example, input interface 606 may include a controller that receives an electrical representation of a packet label and generates a control signal that functions to modulate a swapping sequence on an optical signal.

Switching element 608 is configured to process one or more packet data associated with wavelength channels 605 received from input interface 606 and directing those packet data to a desired destination. Switching element 608 can include any optical and/or electrical components—including any hardware, software, and/or firmware—capable of switching, routing, error checking, and/or managing the one or more packet data or packet labels associated with each wavelength channel 605. In an embodiment, the switching element 608 includes one or more processors configured to execute instructions. In an embodiment, one or more of the processors are digital signal processors (DSPs). In an embodiment, the switching element 608 includes memory and/or a storage device that are configured to store data and/or instructions to be executed by the processor. In an embodiment, the switching element 608 includes photonic chips. In an embodiment, switching element 608 can comprise a ring configuration having one or more core router nodes and at least one management node. Although this example implements a ring configuration, switching element 608 could implement a mesh configuration, a star configuration, or any other configuration without departing from the scope of the present disclosure. In various embodiments, switching element 608 can operate to process wavelength channels 605 at processing speeds of, for example, at least 10 gigabits/second (Gb/s), at least 40 Gb/s, at least 100 Gb/s, or at least 160 Gb/s.

In an embodiment, switching element 608 is configured to route one or more packet data associated with wavelength channels 605 to an output interface 610. Output interface 610 can comprise any optical and/or electrical components including any hardware, software, and/or firmware capable of preparing one or more packet data associated with wavelength channels 605 for communication from router 600. In an embodiment, the switching element 608 includes one or more processors. In an embodiment, the processors include digital signal processors (DSPs). In an embodiment, the switching element 608 includes photonic integrated chips. In this example, output interface 610 operates to communicate the one or more packet data from router 600 to a desired destination through an appropriate wavelength channel 613.

In an embodiment, each combiner 614 is configured to combine output wavelength channels 613 into one or more output optical signals 615 for communication over a communication links 616. In an embodiment, combiner 614 includes, for example, a wavelength division multiplexer. The structure and function of communication link 616 can be substantially similar to the structure and function of communication link 602. In this example, communication links 616 operate to couple router 600 to other optical and/or electro-optical components.

In this example, the controller 612 is also capable of at least partially contributing to controlling one or more functionalities associated with router 600. That is, controller 612 is not required to be capable of performing the desired functionality alone, but may contribute to the performance of the function as part of a larger routine. Controller 612 can comprise any communication and/or computational device or devices, including any hardware, software, firmware, or combination thereof.

In an embodiment, in operation, the packet data associated with wavelength channels 605 are transparent to the processing functions of router 600. That is, in operation router 600 does not examine the content of the packet data associated with each wavelength channel 605. In some cases, router 600 does examine the contents of one or more packet labels and/or other elements of a frame format associated with wavelength channels 605. In most cases, router 600 operates to maintain the packet data associated with wavelength channels 605 in the optical domain. That is, the packet data associated with each wavelength channel 605 are not subjected to an optical-to-electrical conversion by router 600. In some cases, one or more of the packet labels and/or other elements of a frame format associated with wavelength channels 605 can be subjected to one or more optical-to-electrical and/or electrical-to-optical conversions. In various embodiments, router 600 may be capable of an aggregate capacity of, for example, at least 5 terabits/second (Tb/s), at least 25 Tb/s, at least 50 Tb/s, or at least 100 Tb/s.

In an embodiment, router 600 can operate to minimize and/or avoid contention between packet data associated with optical signals 603 and 615 and/or wavelength channels 605 and 613 within switching element 608 and/or communication links 602 and 616. The term "contention" as used herein refers to a process by which a packet data competes with other packet data for communication over a specific wavelength. In some cases, contention can be minimized by, for example, implementing a ring network architecture or performing wavelength conversion. Minimizing and/or avoiding contention can result in a reduction in the congestion associated with an optical signal wavelength.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:
1. A photonic integrated circuit (PIC), comprising:
a plurality of switches for connection to a bias voltage source;
a plurality of bias inputs, each of the plurality of bias inputs connectable to the bias voltage source via one of the plurality of switches;
a plurality of monitor photodiode (MPD) outputs; and an array of monitor elements arranged in a matrix structure wherein each of the monitor elements is connected between one of the bias inputs and one of the MPD outputs, wherein each of the monitor elements comprises a photodiode and a rectifier diode, wherein the photodiode comprises a first terminal and a second terminal, wherein the rectifier diode comprises a third terminal and a fourth terminal, wherein the first terminal is connected to the third terminal, and wherein the first and third terminals are anodes or the first and third terminals are cathodes.

2. The PIC of claim 1, wherein the second terminal comprises a cathode, and wherein the cathode of each of the photodiodes is connected to the one of the bias inputs.

3. The PIC of claim 2, wherein the fourth terminal comprises a cathode, and wherein the cathode of each of the rectifier diodes is connected to the one of the MPD outputs.

4. The PIC of claim 1, wherein the second terminal comprises an anode, wherein the anode of each of the photodiodes is connected to the one of the bias inputs.

5. The PIC of claim 4, wherein the fourth terminal comprises an anode, and wherein the anode of each of the rectifier diodes is connected to the one of the MPD outputs.

6. The PIC of claim 1, wherein each of the MPD outputs is connected to a respective one of a plurality of trans-impedance amplifiers.

7. The PIC of claim 1, wherein each of the MPD outputs is connected through a switch element to a trans-impedance amplifier that serves multiple monitor elements.

8. The PIC of claim 1, wherein each of the MPD outputs is connected through a respective one of a plurality of output switches to a single trans-impedance amplifier that serves all of the monitor elements.

9. The PIC of claim 8, wherein each of the output switches controls which of the monitor elements are registered at the single trans-impedance amplifier.

10. The PIC of claim 9, wherein each of the output switches comprises one of a rectifier diode and a field effect transistor.

11. A network component configured to monitor optical signals, the network component comprising:
    a transmitter;
    a receiver; and
    an on-chip photonic integrated circuit (PIC), wherein the PIC comprises:
    a plurality of switches for connection to a bias voltage source;
    a plurality of bias inputs, each of the plurality of bias inputs connectable to the bias voltage source via one of the plurality of switches;
    a plurality of monitor photodiode (MPD) outputs; and
    an array a plurality of monitor elements arranged in a matrix structure wherein each of the monitor elements is connected between a corresponding one of the bias inputs input terminals and a corresponding one of the MPD outputs output terminals, wherein each of the monitor elements element comprises a photodiode and a rectifier diode, wherein the photodiode comprises a first terminal and a second terminal, wherein the rectifier diode comprises a third terminal and a fourth terminal, wherein the first terminal is connected to the third terminal, and wherein the first and third terminals are anodes or the first and third terminals are cathodes comprise a same polarity.

12. The network component of claim 11, wherein the second terminal comprises a cathode, and wherein the cathode of each of the photodiodes is connected to the one of the bias inputs.

13. The network component of claim 11, wherein the fourth terminal comprises a cathode, and wherein the cathode of each of the rectifier diodes is connected to the one of the MPD outputs.

14. The network component of claim 11, wherein the second terminal comprises an anode, and wherein the anode of each of the photodiodes is connected to the one of the bias inputs.

15. The network component of claim 11, wherein the fourth terminal comprises an anode, and wherein the anode of each of the rectifier diodes is connected to the one of the MPD outputs.

16. The network component of claim 11, wherein each of the MPD outputs is connected to a respective one of a plurality of trans-impedance amplifiers.

17. The network component of claim 11, wherein each of the MPD outputs is connected to a trans-impedance amplifier that serves multiple monitor elements.

18. A method of operating a photonic integrated circuit (PIC), comprising:
    applying a bias voltage to one of a plurality of bias inputs, each of the bias inputs connected to the bias voltage by a corresponding one of a plurality of switches, each of the bias inputs connected to a first terminal of at least one of an array of monitor elements arranged in a matrix structure, wherein each of the monitor elements comprises a photodiode and a rectifier diode, wherein one terminal of the photodiode is connected to one of the bias inputs and one terminal of the rectifier diode is connected to one of a plurality of monitor photodiode (MPD) outputs;
    applying at least one optical signal to at least one of the monitor elements; and
    registering a photocurrent in at least one of the MPD outputs.

19. The method of claim 18, wherein applying the bias voltage comprises applying the bias voltage sequentially to more than one of the bias inputs in a manner such that the bias voltage is applied to only one of the bias inputs at a time.

20. The method of claim 18, wherein registering the photocurrent in at least one of the MPD outputs comprises controlling which of the photodiode elements are registered at the MPD outputs with an output switch.

* * * * *